United States Patent
Usenko et al.

(10) Patent No.: US 12,002,891 B2
(45) Date of Patent: Jun. 4, 2024

(54) DIODE AND METHOD OF MAKING THE SAME

(71) Applicants: Alex Usenko, Lake St. Louis, MO (US); Anthony Caruso, Overland Park, KS (US); Steven Bellinger, Manhattan, KS (US)

(72) Inventors: Alex Usenko, Lake St. Louis, MO (US); Anthony Caruso, Overland Park, KS (US); Steven Bellinger, Manhattan, KS (US)

(73) Assignee: THE CURATORS OF THE UNIVERSITY OF MISSOURI, Columbia, MO (US)

( * ) Notice: Subject to any disclaimer, the term of this patent is extended or adjusted under 35 U.S.C. 154(b) by 70 days.

(21) Appl. No.: 17/855,735

(22) Filed: Jun. 30, 2022

(65) Prior Publication Data
US 2023/0299210 A1    Sep. 21, 2023

Related U.S. Application Data

(60) Provisional application No. 63/216,550, filed on Jun. 30, 2021.

(51) Int. Cl.
*H01L 29/861* (2006.01)
*H01L 29/66* (2006.01)

(52) U.S. Cl.
CPC ...... *H01L 29/861* (2013.01); *H01L 29/66121* (2013.01); *H01L 29/66136* (2013.01)

(58) Field of Classification Search
CPC ............. H01L 29/861; H01L 29/66121; H01L 29/66136; H01L 21/187; H01L 21/2252;
(Continued)

(56) References Cited

U.S. PATENT DOCUMENTS

2013/0045586 A1*  2/2013  Ma .................. C30B 29/06
                                                    257/E21.318
2016/0336409 A1* 11/2016  Schulze ............ H01L 21/26513

FOREIGN PATENT DOCUMENTS

WO   WO-2018115129 A1 *  6/2018

* cited by examiner

*Primary Examiner* — Shahed Ahmed
(74) *Attorney, Agent, or Firm* — David E. Novak; Brannon Sowers & Cracraft PC

(57) ABSTRACT

A method of producing a four-layer silicon diode, including selecting a first silicon wafer, wherein said first silicon wafer is CZ-grown B-doped with <100> orientation, a resistivity of less than 0.01 Ohm-cm, and an oxygen content of greater than 10 ppma, and then selecting a second silicon wafer, wherein said second silicon wafer is CZ-grown P-doped with <100> orientation, a resistivity of less than 0.005 Ohm-cm, and an oxygen content of greater than 10 ppma, followed by cleaning the respective first and second silicon wafers. The wafers are then HF treated to yield respective first and second cleaned wafers, the first cleaned wafer is positioned into a first furnace and the second cleaned wafer is positioned into a second furnace, wherein the first and second furnaces are not unitary. Next is annealing the respective first and second cleaned wafers in a reducing atmosphere to yield respective first and second respective out-diffused gradient wafers, followed by bonding together respective first and second heat-treated wafers to yield a mated and/or bonded four-layer substrate having a first heavy doped n-type layer, a second gradient doped n-type layer, a third gradient doped p-type layer, and a fourth heavy doped p-type layer.

11 Claims, 6 Drawing Sheets

(58) Field of Classification Search
CPC ... H01L 29/36; H01L 29/6609; H01L 29/868; H01L 2924/12; H01L 29/8611; H01L 2224/80894–80896; H01L 2224/83894–83896

See application file for complete search history.

DIODE AND METHOD OF MAKING THE SAME

CROSS-REFERENCE TO RELATED APPLICATIONS

This patent application claims priority to U.S. Provisional Application No. 63/216,550, filed Jun. 30, 2021, titled "Diode and Method of Making the Same". The benefit under 35 USC § 119(e) of the United States provisional application is hereby claimed, and the aforementioned provisional patent application is incorporated herein by reference.

GOVERNMENT FUNDING

This patent application was made with government support under contract number N68335-19-C-0255 awarded from the Office of Naval Research. The Government has certain rights in this invention.

TECHNICAL FIELD

The invention relates generally to semiconductor devices, and, more particularly, to power semiconductor diodes and methods for making the same, such as silicon drift step recovery diodes (DSRD) operatable in a pulsed mode as a semiconductor opening switches.

BACKGROUND

Semiconductor diodes may operate in various modes depending on application requirements. For example, semiconducting diodes may be employed as part of a rectifier circuit. Other diode applications include forming short current/voltage pulses or for harmonic generation, and the like. This operation mode of diodes has come to be known as "step recovery" or "drift step recovery" mode.

These diodes are the major components of pulse generators. Drift step recovery diodes (DSRD) may be used to drive a solid state pulse generator, which provides the same function as a Marx generator (a circuit for generating a high-voltage pulse by charging a number of capacitors in parallel, then discharging them by suddenly connecting them in series) while having attractive advantages over the Marx—longer service time before failure, faster repetitions rate, lower jitter, smaller weight/size, and the like. The pulse mode put some specific requirements on diode design, and eventually on the diode manufacturing process flow.

Pulse generators circuits are typically designed to obtain high voltages—from the kiloVolt (kV) to the megaVolts (mV) range. Silicon has $3 \times 10^5$ V/cm electrical breakdown field. This means that to withstand 1 kV reverse bias, the diode must have a depletion zone at least 33 microns in thickness (which is formed in low doped Si). In diode manufacturing, a safety margin is typically added to account for processing deviations, materials nonuniformity, structural variations, and the like, in order to achieve a 1 kV rated diode; the depletion zone is typically designed to be about 100 microns thick. Silicon power and high voltage diodes are typically manufactured using diffusion of dopants. FIG. 1 shows a simplified diode cross section and the diode dopant profile. Requirement of the thick depletion width can be achieved by using high diffusion temperatures, long diffusion times, and/or dopants having high diffusion coefficients in silicon. Also, the Si wafer is typically thinned before the diffusion step, considering that tails of the p- and the n-diffusion profiles should almost meet, thus the diode base region has ideally zero thickness. If the wafer is not properly thinned, the diode will have excessively thick base regions which will degrade its pulse performance resulting in excessive voltage rise time on a load, and the like. If overthinned and/or over-diffused, the p- and n-tails will overlap, and the diode will fail to meet breakdown voltage specs.

The most typical prior art process is illustrated in FIGS. 2A-2G 2. Starting wafers are usually low p-doped float zone wafers as are commonly found in power semiconductor devices with vertical current flow and minimize or exclude detrimental effects of oxygen thermal donors commonly found in the bulk of regular Czochralski (Cz) wafers, and to meet a tight resistivity specification requirement (with Cz wafers being those silicon wafers made by dipping a precisely oriented rod-mounted seed crystal is into molten silicon ad then slowly retracting the rod while rotating the same; by precisely controlling temperature gradients, rate of retraction, and speed of rotation, a large, single-crystal, cylindrical ingot is pulled the melt).

First, wafers are ground and polished to about 200 microns thickness. Then, solid source dopant films are deposited on wafer surfaces; in this example, aluminum or gallium sources on one side and phosphorus on the opposing side of the wafer. Then, the wafer is sealed, such as by CVD deposition of silicon nitride to prevent cross contamination and dopant losses due to out-diffusion. The next step is simultaneous drive-in diffusion of both n and p dopants at temperature of 1250° C. or higher, during a 100-200 hour soak in a furnace. Next, silicon nitride film and solid diffusion sources are stripped away, and shallow p+ and n+ diffusion performed to ensure good Ohmic contacts. The wafers then are cut into dies, saw damaged silicon along the die periphery is etched away, and any side surfaces of the dies are passivated with a silicone gel. A finalizing step is metal contact deposition and metallization on anode and cathode sides of the diode.

This process has several disadvantages:
1. When thinned down to 200-microns, the wafers become mechanically weak and often warp or brake in the furnace during the high temperature drive-in;
2. Float zone silicon develops slips (i.e., dislocation walls/low angle twins) if processed above 1100 C. During the 100-200-hour long 1250° C. thermal processing 'drive-inn' step, almost the entire wafers develop such slips, thus lowering the effective yield. Worse, if the slip intersects a die, the die becomes nonfunctional;
3. Deep diffusion is not a well controllable process. Diffusion along defects, such as dislocations, is much faster than in perfect crystalline Si. Thus, eventual diffusion depth is heavily non-uniform across the wafer, and diode base thickness varies as well. Resulting dies have very wide distribution of breakdown voltages, leakage currents, pulse rise times, and the most of other specs. In other words, this process inherently has very low yield;
4. Using FZ starting wafers excludes internal gettering. Gettering is for contamination removal, especially for the contaminants introduced during diode manufacturing. This prior art process requires high temperature and long in-diffusion step. This is when the contamination risk is the highest. For example, the wafers are prone to contamination by impurities coming from furnace walls, giving rise to a process characterized by low controllability and low process repeatability.

This process flow was developed in 1960s and basically has not changed since. Therefore, there has not been any significant improvements in DSRD performance—voltage rise time on load for 1000-Volts diode exceeds nanosecond, dV/dt is less than 1012 V/s, or the like, since the 1960's. Better DSRD performance nonetheless has been achieved in the art, such as with SiC diodes. However, SiC has its own limitations—high cost of initial wafers and processing, no p-type dopant available, no diffusion available, wet etch does not exist, high processing temperatures, ion implantation of dopants suffers from non-annealable post-implant defects, thickness of epitaxial layers is limited, and the like. Thus, there is a need for improved Si-based DSRD devices and methods for manufacturing the same. The present novel technology addresses this need.

SUMMARY OF THE INVENTION

The DSRD structure is built by the following process flow:
1. Heavy p-doped initial wafer is annealed in reducing environment—to out-diffuse p-dopant and oxygen from surface down to desired depth.
2. Heavy n-doped initial wafer is annealed in reducing environment—to out-diffuse n-dopant and oxygen from surface down to desired depth.
3. These 2 wafers are bonded together using a hydrophilic fusion bonding process.
4. Wafer assembly is annealed to dissolve the thin SiO2 and out-diffuse oxygen from the bonding interface.
5. The wafer assembly is thinned from both sides until a SEMI standard for a single wafer reached. This ensures high yield on next processing steps in an automatic robotic equipment.
6. Wafer assembly is diced into dies and the dies are finalized with a standard metallization and side passivation steps.

DETAILED DESCRIPTION

Figure 1:
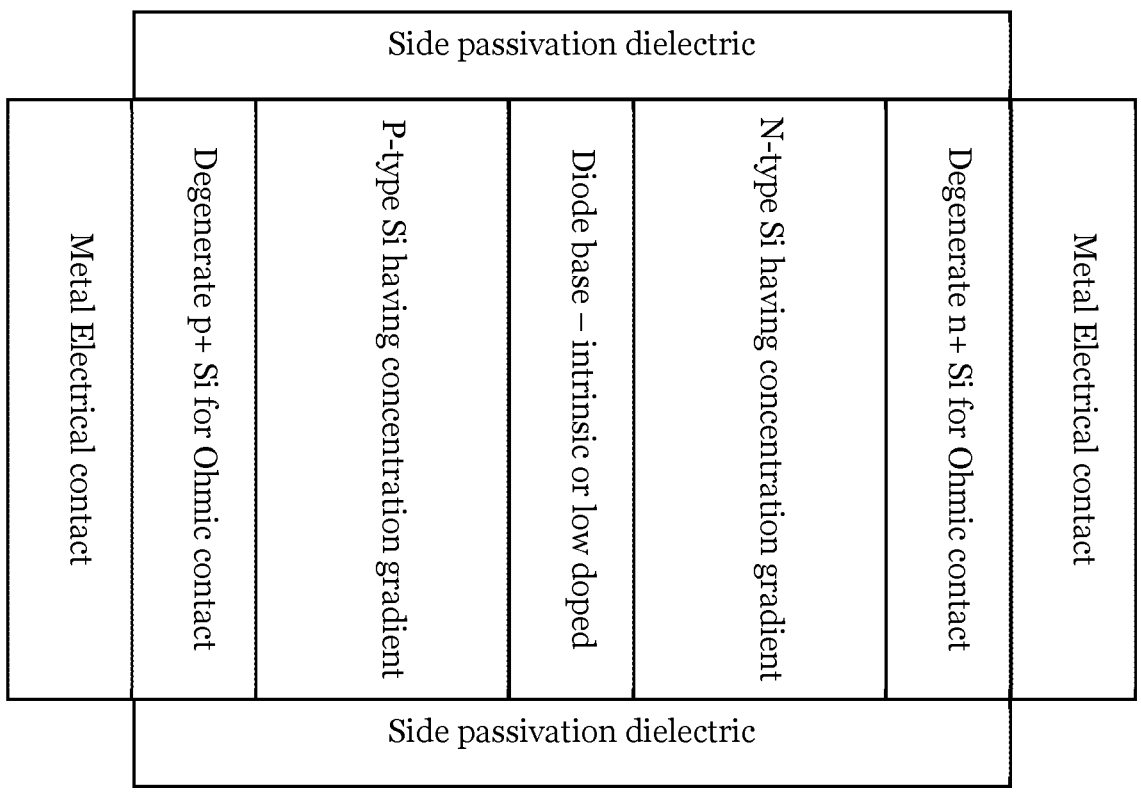
FIG. 1A shows a schematic cross-sectional view of a prior art DSRD and FIG. 1B is a schematic view of a prior art doping profile.
Figure 1:
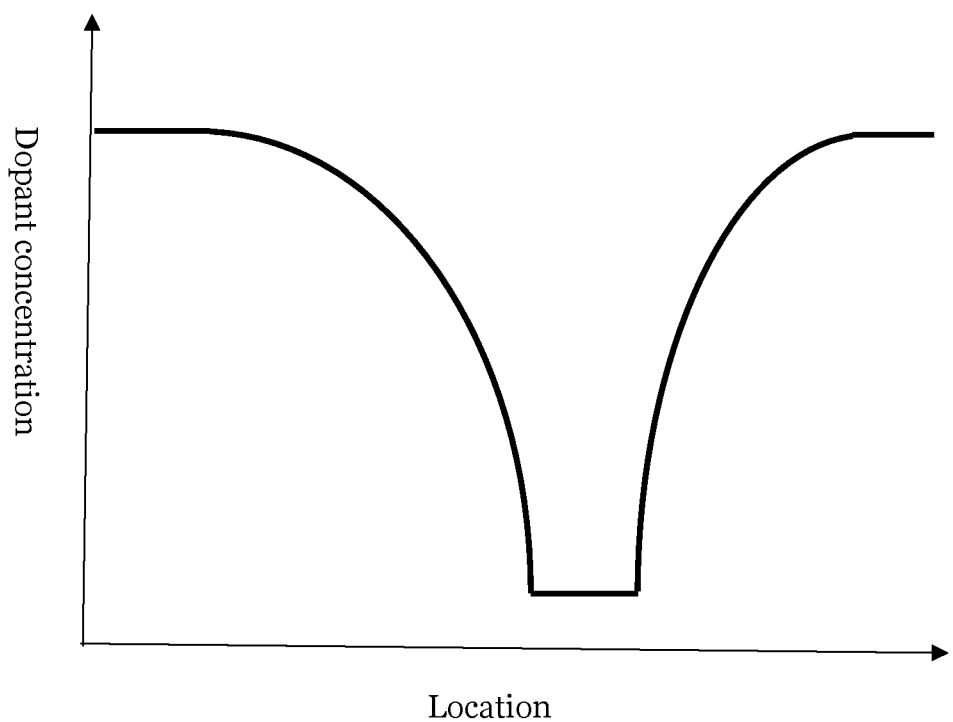
Figure 2:
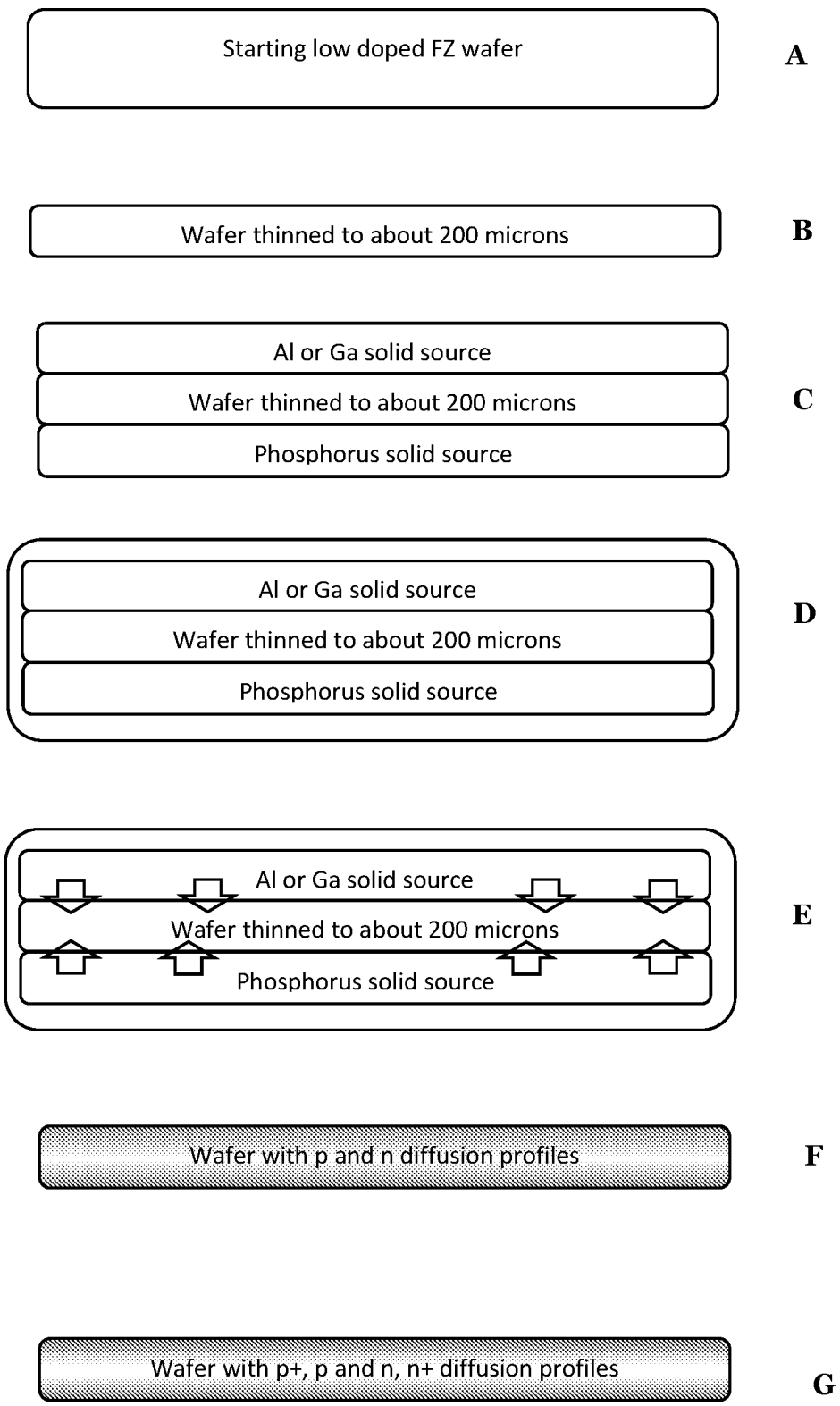
FIGS. 2A-2G schematically shows DSRD process flow in the prior art.

For the purposes of promoting an understanding of the principles of the invention and presenting its currently understood best mode of operation, reference will now be made to the embodiments illustrated in the drawings and specific language will be used to describe the same. It will nevertheless be understood that no limitation of the scope of the invention is thereby intended, with such alterations and further modifications in the illustrated device and such further applications of the principles of the invention as illustrated therein being contemplated as would normally occur to one skilled in the art to which the invention relates.

First Preferred Embodiment

As opposed to the above-recited prior art processes, the novel technology presented herein requires no dopant in-diffusion steps. In contrast, the novel technology utilizes dopant out-diffusion steps (the 'drive-in' is supplanted by a 'drive-out' process) whereby heavily doped starting wafers are treated to diffuse dopant thereout of. This allows the use of regularly Cz-grown Si wafers instead of float zone (FZ) ones. The switch from FZ to CZ wafers further results in a number of practical advantages, such as advantages in quality, yield, and performance of final DSRD devices as described below.

Figure 3:
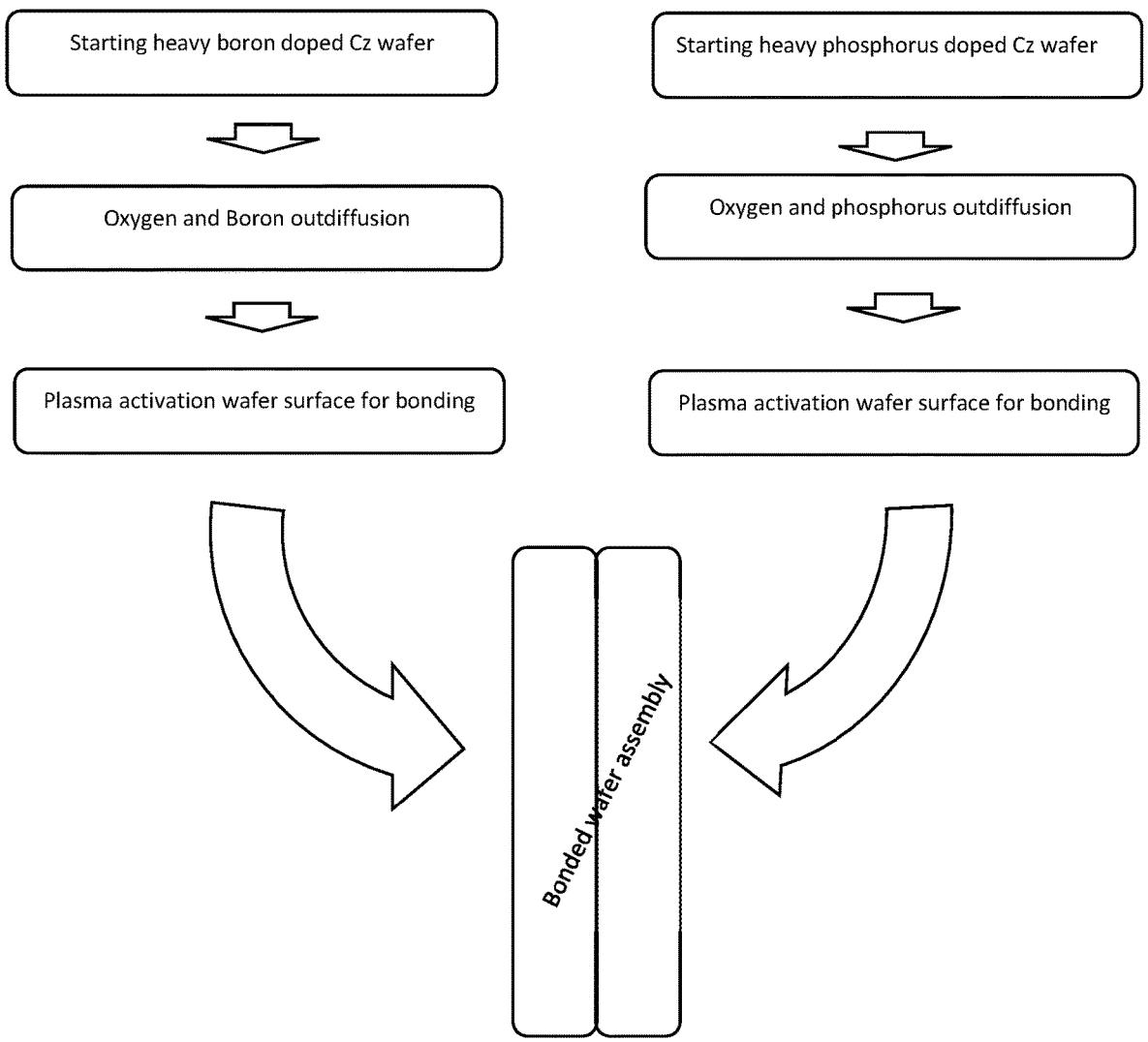
FIG. 3 schematically shows DSRD process according to a first embodiment of the present novel technology out-diffusion device manufacturing process.
Figure 4:
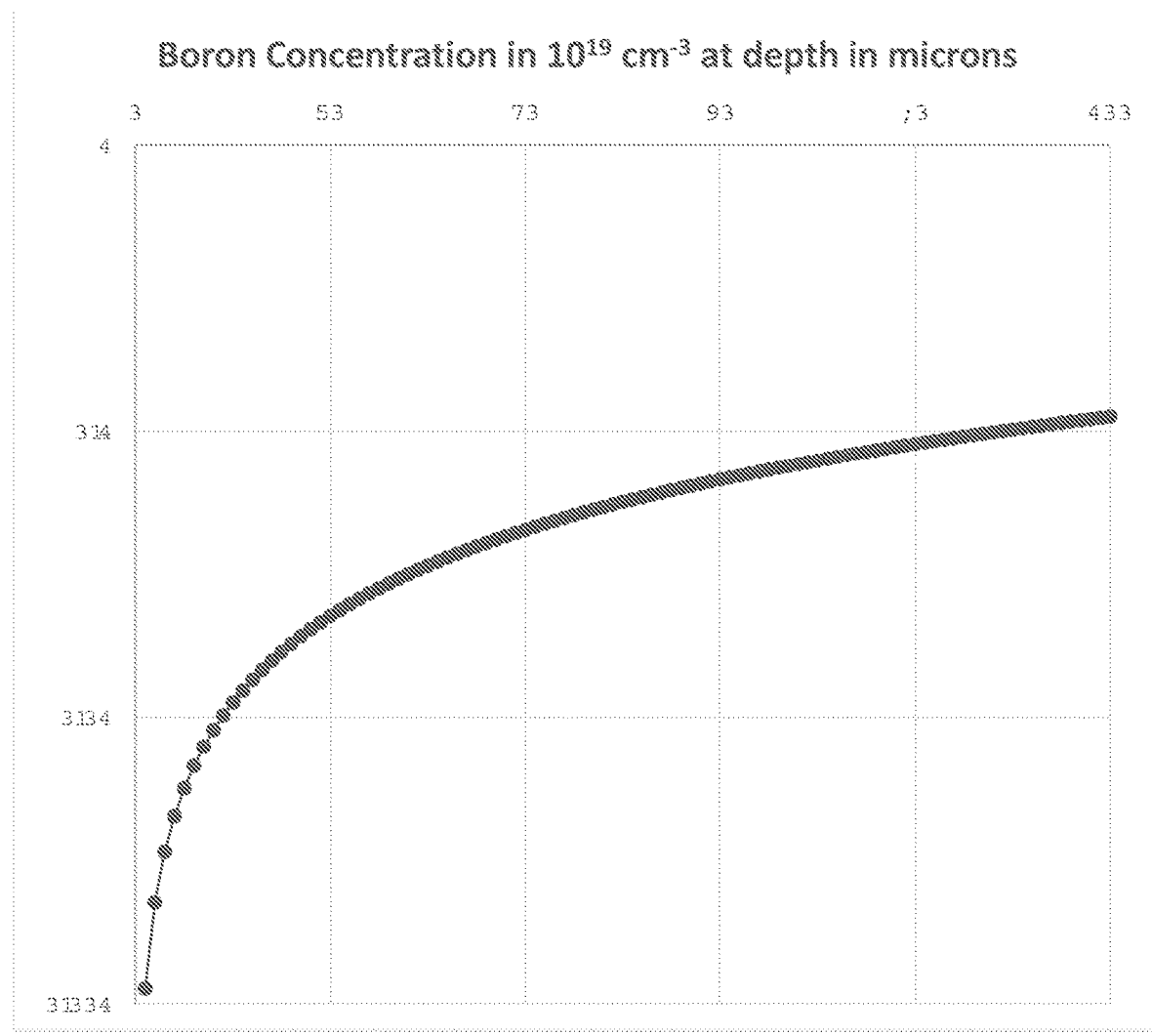
FIG. 4 graphically illustrates a typical boron dopant profile in wafer after the out-diffusion process of FIG. 3.
Figure 5:
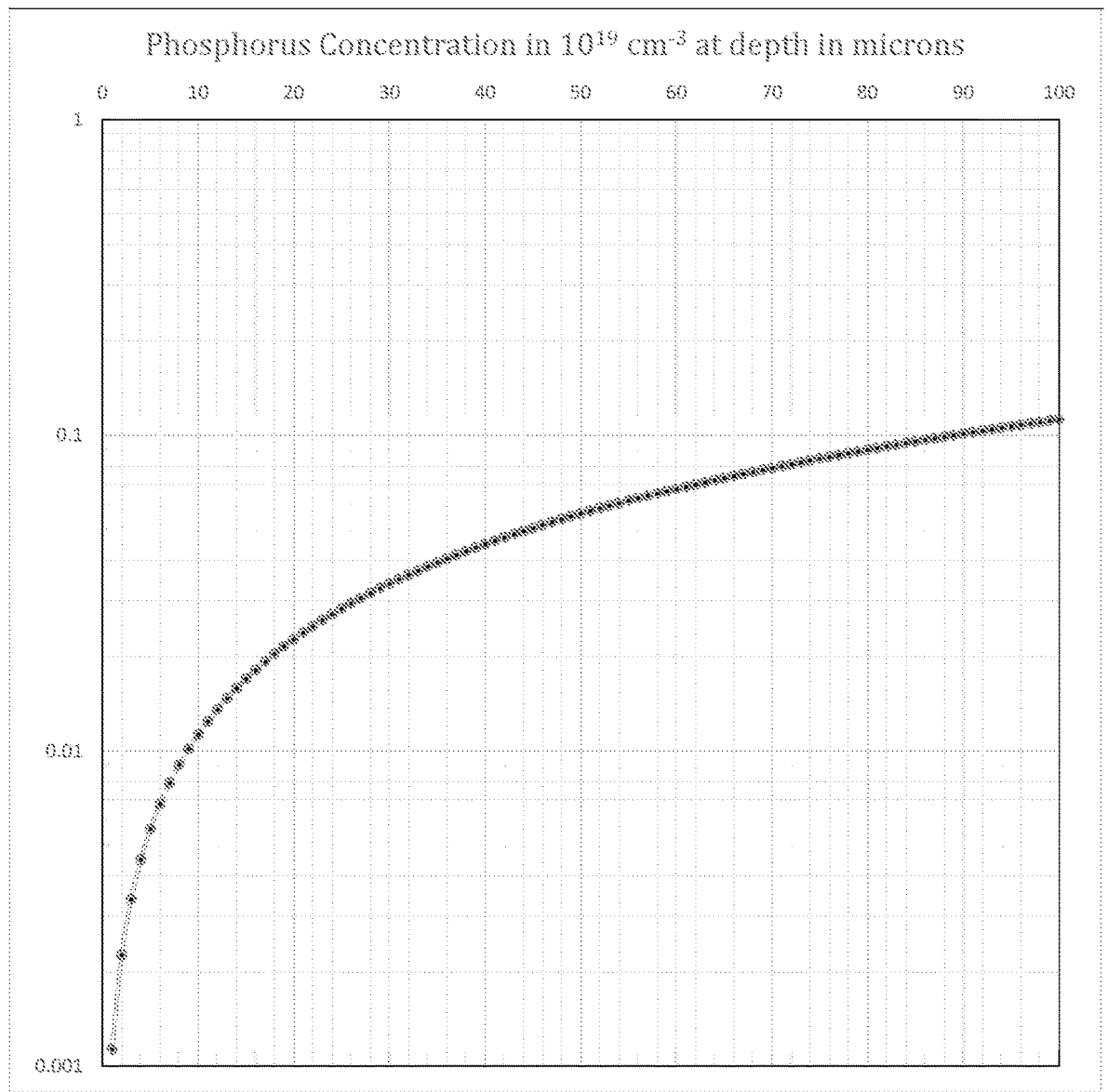
FIG. 5 shows a typical phosphorus dopant profile in wafer after the out-diffusion process of FIG. 3.

As illustrated in FIGS. 3-5, during the out-diffusion process both dopants and oxygen are removed from near surface regions of the wafers. Also, crystal originated particles (COPs), also called vacancy precipitates, are dissolved near surface. Thus, denuded zones are formed from surface to a desired thickness of the wafers. In a sense, the denuded zones are equal in electrical properties to the float zone silicon, and to epitaxial silicon, as they effectively have no COP, no oxygen precipitates, and no oxygen thermal donors. Thus, it is possible to create layers in the wafer having resistivity higher than 100 Ohm-cm. This is attractive to high voltage power devices, including DSRDs.

During the drive-out diffusion of a dopant, a specific doping profile is created—it follows error function—erf. This is different from a profile that is obtained by dopant drive-in diffusion. If dopant diffuses from a solid source on wafer surface into the wafer, the doping profile follows complementary error function—erfc. If the dopant diffuses from an ion implanted layer, the doping profile is Gaussian. However, all 3—erf, erfc, and Gaussian profiles are not different enough to significantly affect DSRD performance significantly. More important is that the thickness of profiles is controlled by diffusion coefficient of a given specie in silicon. For example, to obtain 100-micron deep profile about the same thermal budget is needed, regardless, whether processing is by drive-in or drive-out diffusion.

One limitation, albeit not a very significant one, between the in-diffusion and the out-diffusion routes is that the drive-in way can use the fastest diffusion species for p-type doping—such as aluminum and/or gallium. Drive-out diffusion is currently limited to boron for p-type, simply because the heavy Al- or Ga-doped wafers are not commercially manufactured (not yet readily available). Thus, to get the same profile depth of p-region, the drive-out diffusion needs 3-5 times higher thermal budget. This is not a critical limitation, as Cz wafers are much more resistant to slips as compared to FZ ones, and this limitation will become a non-issue as Al- and/or Ga-doped wafers become more commonly available as their demand increases. High diffusion temperatures can be safely used thus decreasing furnace processing time. Diffusion coefficients grow exponentially with temperature, thus relatively small processing temperature increases can be significant. Cz wafers are much more slip resistant because they have up to $10^{18}$ cm$^{-3}$ oxygen content. Oxygen at that concentration forms oxygen precipitates which in turn act as dislocation lockers. Eventually, dislocation movements are heavily retarded, which means that slips are not formed even at temperatures close to melting temperature of Si.

Bulk microdefects (BMDs) in Cz wafers (such as COPs and oxygen precipitates together) serve as internal gettering sites in the wafers. Thus, the instant novel process affords internal gettering that was not possible in the prior art processes. Having the internal getter, the process becomes near independent of contaminations added during processing—as all incoming contaminations diffuse away from active diode areas and are subsequently captured by the getters. Yield and quality of final power devices thus drastically improve compared to known art process.

Another advantage of instant novel process is better manufacturability. Cz wafers are readily available in 200 mm and 300 mm sizes, thus more economically efficient manufacturing is possible compared to using FZ wafers that are only currently available in smaller sizes, 100 mm and 150 mm. Manufacturability is also improved as semiconductor processing tools on 200 mm and 300 mm are fully automated, while 100- and 150-mm tools are basically manual. Fab automation on 100 mm and 150 mm fabs is minimal available. While 300 mm fabs enjoy very high levels of automation, clean rooms are almost people-free. This allows tight statistical process control (SPC), much better cleanliness, and thus eventually results excellent die-to-die, wafer-to-wafer, and/or lot-to-lot repeatability.

Figure 6:
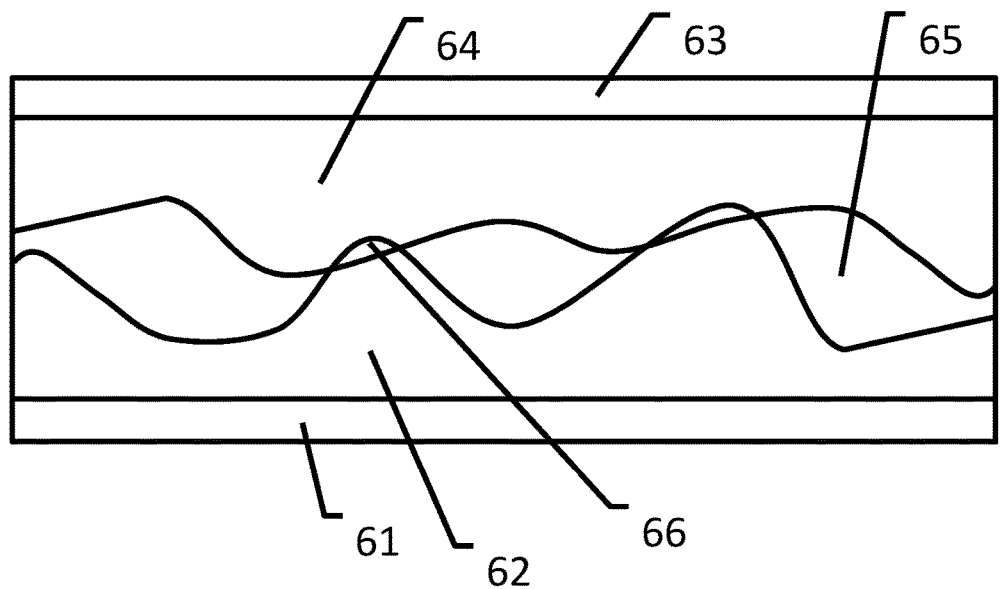
FIG. 6 shows a simplified cross section of wafer with the diode structure made by the prior art process.
Figure 7:
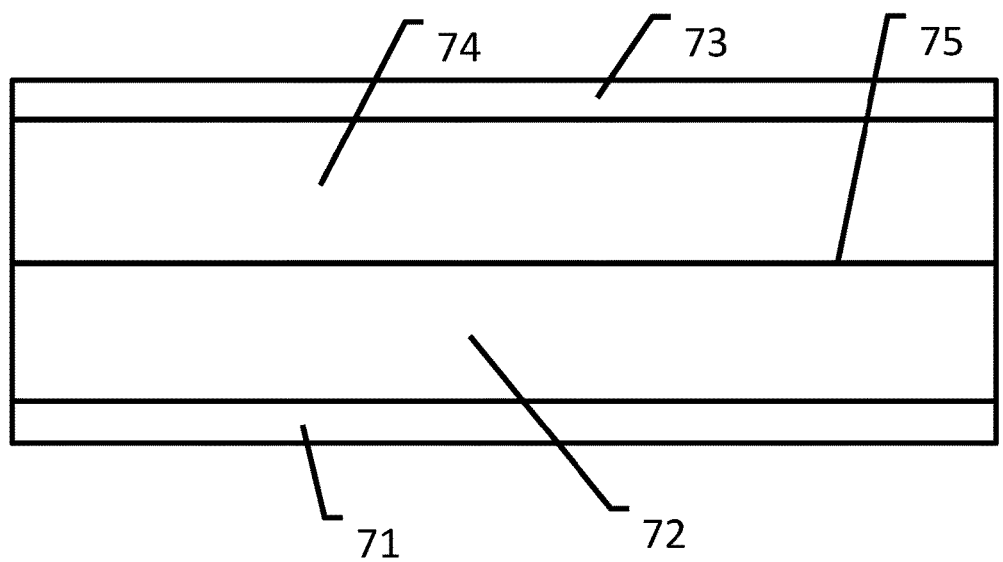
FIG. 7 shows a simplified cross section of wafer with the diode structure made by the out-diffusion process of FIG. 3.

FIG. 6 and FIG. 7 illustrate advantages of the instant novel diode and its manufacture method over the prior art by comparison of schematic cross section of wafers. Both have $p^+$-$p^-$-$i$-$n^-$-$n^+$ structure. FIG. 6 shows the prior art, and FIG. 7 shows the cross section of instant novel wafer. 61 and 71 are $p^+$ areas, 63 and 73 are $n^+$ areas, 62 and 72 are p areas with concentration gradient, 64 and 74 are n areas with concentration gradient. Gradient doped areas 62 and 64 in the prior art wafer are non-uniform across the wafer; and eventually there are areas 65 that are beyond of both diffusion tails, so these areas have flat doping concentration equal to the doping of the starting wafer. Having the flat doped region means that diode cut from this piece of wafer will be "soft" (i.e., have long switching time). Also, there are areas 66 where diffusion tails overlap. Diodes made from these areas will have relatively low and thus undesirable breakdown voltage. There are no similar problematic 65 and 66 areas in wafers processed by the novel method discussed herein, as shown in FIG. 7. Thus, diodes from different areas on the wafer all have very similar performance.

In this Example, 200 mm boron doped Cz silicon wafers <100> orientation with resistivity <0.01 Ohm-cm, 16 ppma oxygen, and 200 mm phosphorus doped Cz silicon wafers <100> orientation with resistivity <0.005 Ohm-cm, 16 ppma oxygen where used. Wafers were chosen with the highest oxygen content available, so as to maximize slip resistance and maximize internal gettering. Boron and phosphorus doping levels were chosen to slightly exceed the degeneration level of ~$10^{19}$ cm$^{-3}$, and so exhibit more metallic than semiconductor properties, thus minimizing parasitic series electrical resistivity of DSRD devices. Higher doping level is not desirable, as B-doped wafers have lower lattice constants, while P-doped wafers have higher lattice constants as compared to pure Si wafers. This difference interferes with further wafer bonding such that an ideal epitaxy-like bonding interface very difficult to achieve, if not impossible, and some structural defects are inevitable formed on the bonding interface. In working DSRD these defects increase recombination at p-n junction location, thus improving the pulse performance, as opposed to degrading it. However, relatively large structural defects are typically undesirable.

Lots of B- and P-doped wafers were cleaned before annealing in a standard RCA wet clean bath with SC1 and SC2, HF-last and Marangoni drying. HF-last saves some furnace time as there is no need to bake out native or chemical oxide. The wafers were then immediately loaded into furnaces, and the B-doped and P-doped wafers were processed in dedicated furnaces to exclude cross contaminations. An out-diffusion anneal step was performed in hydrogen, though other suitable environments, such as an argon/hydrogen "forming gas" mixture can be used. The annealing process step was performed at 1300° C. for 48 hours; annealing may take place between 1100 degrees Celsius and 1350 degrees Celsius, and may have a duration of between 10 and 72 hours. FIG. 3 shows profiles for boron and for phosphorus after the out-diffusion step.

In addition to removal of boron and phosphorus from desired areas—from surface to some predetermined desired depth, such as from ten to one-hundred microns, the hydrogen annealing improves surface roughness of wafers, improves nanotopology, and forms a denuded (oxygen free) zone, while preserving excellent mechanical properties of wafers, especially resistance to slips even at high annealing temperatures.

The present technique takes advantage from three simultaneous processes operating during the annealing of wafers in hydrogen (or Ar/H) ambient: (1) desired diode dopant profiles are created by out-diffusion of the dopants; (2) future active area (base) of the diode gets cleaned of oxygen, thus excluding formation of undesirable oxygen donors in the diode active area; and (3) dissolving of vacancy precipitates (COPs) in the active area improves electrical properties of the final diode devices.

The next step is preparing the wafers for the fusion bonding. This is performed by plasma activation of wafer surfaces in the oxygen plasma module of a fusion wafer bonder. Plasma processing forms a thin oxide on surfaces to be mated. This oxide is different in properties from native oxide and from chemical oxide obtained by SC1 clean, insofar as it allows void free wafer bonding even for 1-2 nm thick oxides on both surfaces. Bonding of two wafers with native oxides almost always results in heavy void formations, as bonding requires several monolayers of water to be adhered on surfaces. Upon mating of two unitary wafers, and subsequent annealing, the water forms steam bubbles that give rise to de-bonding and final bonding voids that weaken adhesion of the bonded wafers. In the instant novel wafers, steam bubbles are prevented or minimized by minimal to no voids. Plasma oxide has enough porosity to adsorb that water, thus no voids are formed to weaken the bond.

After the surface activation, a robotic arm typically moves the wafers into a bonding chamber. The standard bonding recipe is adjusted here—wafers are kept longer under vacuum—to allow excess water to evaporate. Then the wafers are mated, and low temperature annealed using standard tool recipe, then the two-wafer assembly is unloaded from the tool.

The next step is annealing in an oxygen-free atmosphere, such as nitrogen, argon, mixtures thereof, and the like at 1100-1200 C for 1-2 hours. During this step the former plasma oxide film between the wafers is dissolved and oxygen diffuses into getter—heavy doped bulk of wafers. An epitaxial like interface is formed at former bonding interface. Here the problem is resolved by replacing the native oxide by plasma oxide and controlling of the adhered water by timing in vacuumed bonding chamber.

For hydrophobic bonding, wafer surfaces are prepared by HF dip bath. Wafers retrieved from the bath have surfaces terminated with hydrogen. The wafers are promptly mated (no water rinsing in between) and annealed to finalize the bonding. However, epitaxy-like interface is not achieved this way. The reason is that an initial bridges between the two wafers are just two hydrogen atoms. These bridges are much shorter than the bridges in hydrophilic bonding consisting of hydroxyl radicals and several molecules of water. Thus, surface roughness requirements for hydrophobic bonding are much stricter than for hydrophilic where 5 Angstrom rms roughness is sufficient, while hydrophobic requires near perfect atomically smooth surface; even an atomic step is enough to generate a void. Therefore, the hydrophilic bonding is widely used in semiconductor industry, while hydrophobic has never been employed on an industrial scale. Upon annealing of hydrophobically bonded wafers, there are no forces that would close the gaps between the surfaces, thus thin voids still exist. In the hydrophilic case, the hydroxyl species available on the bonding interface enhance lateral diffusion of silicon along the interface, and eventually the gaps are closed.

Out-diffusion followed by wafer bonding gives the following result unattainable in the known art processes: (1) it allows the o use of heavy doped Cz wafers which provide internal gettering; (2) it allows diode thickness up to total thickness of two unitary bonded wafers, while in the existing art process the diode thickness was limited to total diffusion depth of dopants, typically 200 micron or less; (3) high BMD density in the bulk of both wafers gives rise to an improvement in slips; basically, slips are greatly to totally suppressed, while in the existing art process the slips were the major yield killer.

The internal gettering results in much more robust process as it is not sensitive to contaminations. A thicker wafer allows for the making of much bigger area individual diodes, thus much higher electric currents can be accommodated. Also, thicker wafers have much less propensity to break during the processing, thus resulting in a higher effective process yield.

Further, the opposite sides of the wafer assembly are ground (polishing is optional) to remove low doped (due to out-diffusion) areas. Moreover, the same processing steps as in the known art process finalizing steps m ay be performed—metal contact layers are deposited, wafer assembly is cut into dies, cutting-related side damages are etched away, and side surface is passivated. DSRD diode dies are now ready for stacking and packaging.

Second Embodiment

This embodiment differs from the entire process flow described in the first embodiment by one step—the dopants/oxygen drive-out step. This process is akin to the magic denuded zone (MDZ) process. The MDZ process generates vacancy flux from wafer bulk toward the surface. Thus, out-diffusion of dopants and oxygen is enhanced. The vacancy flux is generated by temperature transients in the wafer. Technically, this is realized by rapid thermal annealing (RTP). The primary parameter controlling vacancy behavior, and thus diffusion enhancement, is the cooling rate of the wafers right after the RTP tool stops heating the wafers. One efficient cooling rate is around 100° C./s, and easy achievable in commercial RTP tools can form very deep—up to or exceeding 100-micron zones denuded from oxygen while using much smaller total thermal budget as compared to regular furnace annealing. Likewise, as in the MDZ process, COPs (vacancy clusters), interstitial oxygen, and oxygen precipitates are removed from wafer surface down to desired depth, such as up to 100 microns or deeper. Dopant diffusion is not as sharply modulated by vacancy profile manipulation, so the recipe for this process typically includes uses more RTP repetitions than a standard MDZ process.

Third Embodiment

This embodiment differs from the entire process flow described in the first embodiment by one step—wafer bonding. Though the bonding method described in this embodiment drives a change in the total process flow, the thin oxide dissolution step is omitted as no oxide between the wafers is utilized here.

After the dopants and oxygen drive-out step, the wafers are bonded using surface activated bonding (SAB). In the SAB process the wafer pair is loaded into high vacuum chamber. Both surfaces to be mated are bombarded by argon in conditions that causes sputtering of native oxide and amorphizing of several top nanometers of silicon below the wafer's surfaces. Then a mechanical manipulator is employed to mate the wafers. Next the bonding is finalized through solid phase epitaxy (SPE). SPE may be performed done either in the vacuum chamber or after unloading the wafer assembly from the bonding chamber. SPE is an annealing step typically accomplished at temperatures of 450-600° C. in slow ramp-up mode. The SAB results in increased quality of the bonding interface—in terms of voids and interface defects as compared to hydrophobic bonding and to bonding in vacuum, and right now is only the method of direct silicon-to-silicon bonding that went to volume manufacturing scale.

Fourth Embodiment

This is a variation of the $3^{rd}$ embodiment as described above, but it uses only standard equipment available at almost every silicon foundry. Thus, it has an advantage of easy and fast implementation in volume production. A novel SAB-like process is used here. First, both wafers after the drive-out step are processed by ion implantation. The implantation conditions are chosen to amorphize the wafer near surface layers. As amorphization only is needed here, non-doping implant species, such as silicon, germanium, or argon or like species may be utilized; however, it turns out that the higher the atomic number of the implanted specie, the lower the amorphization threshold dose, and the thinner the resulting amorphized layer. The lower implantation dose yields cost savings, and the thinner amorphized layer yields higher wafer bonding yield. The heaviest ion specie that any implanter may routinely accommodate is antimony. Heavier species as xenon or bismuth may also be selected, but these are specialty implant materials and are rarely readily available at foundries. Also, one unique advantage of antimony is that for 80 keV implantation energy, the ion projected range (and thus thickness of amorphized silicon) is only about 40 nm. For room temperature implantation, the threshold dose for amorphization is below $10^{14}$ cm$^{-2}$. Sb implant recipe was $2*10^{14}$ cm$^{-2}$ dose at 60 keV energy.

After the implantation, both wafers were cleaned with a standard RCA wet clean bath in sequence SC1/SC2/HF. After the HF-last, the wafers were not rinsed so as to preserve hydrogen terminated surfaces. The wafers were then immediately mated. After mating, bonding was finalized by solid phase epitaxy annealing at 600° C. with 10° C./minute ramp up rate. The antimony profile in the final wafer assembly is found to be significantly different from the as-implanted state: instead of two Gaussian profiles, the profile rather resembles delta-doping. Antimony exhibits a high segregation coefficient on amorphous-crystalline interface, which possibly explains the observation.

A high-quality bonding interface was observed, with no voids found. The final doping profile was quite unusual for the high voltage diode, having a delta doping spike centered on the diode base. Comparing diodes made by $3^{rd}$ and $4^{th}$ embodiments, surprisingly no difference in electrical performances were found—the first diode is made according to the $3^{rd}$ preferred embodiment (i.e., no delta spike) and second diode made according to the $4^{th}$ embodiment—no significant differences was found—neither in breakdown voltage, nor in reverse bias leakage current, possibly because the thickness of the delta doped spike is just a fraction of percent of the total thickness of carrier depleted region of the diode, which is above 100 microns here.

Fifth Embodiment

This embodiment is an even more economical version of the fourth preferred embodiment. Here, to get the amorphous layers on wafer surfaces to be bond, an amorphous silicon deposition is performed instead of the amorphizing ion implantation step. All other process sub steps remain the same.

There are many ways to deposit a very thin amorphous silicon film over the silicon wafer: LPCVD below 600 C (including using a standard epitaxy tool), PECVD (plasma enhanced chemical vapor deposition), and the like. Still, the most commonly used way to accomplish this step is a e-beam evaporation, because the final wafer surface must be bondable. This means the final wafer surface should have low roughness, such as 0.5 Angstroms rms or below. To satisfy that requirement, we used a commercially available e-beam metal deposition tool and selected a silicon wafer as the target for the electron beam driven evaporation.

Upon the process optimization (wafer preparation before loading into the chamber, wafer temperature during the deposition, e-beam gun current, and like factors), we deposited a near 5 nm thick amorphous silicon layer on both p- and n-doped wafers of the future bonded assembly. Atomic force microscopy (AFM) measurements confirmed that the surface roughness is still below 0.5 Angstrom rms, thus the wafers remain bondable.

The next processing sub steps were the same as in the $4^{th}$ preferred embodiment— HF-last clean, mating, and solid phase epitaxy anneal. Process yield was found to be lower than in the $4^{th}$ embodiment, and in the $3^{rd}$ embodiment, but still reasonable.

While the invention has been illustrated and described in detail in the drawings and foregoing description, the same is to be considered as illustrative and not restrictive in character. It is understood that the embodiments have been shown and described in the foregoing specification in satisfaction of the best mode and enablement requirements. It is understood that one of ordinary skill in the art could readily make a nigh-infinite number of insubstantial changes and modifications to the above-described embodiments and that it would be impractical to attempt to describe all such embodiment variations in the present specification. Accordingly, it is understood that all changes and modifications that come within the spirit of the invention are desired to be protected.

What is claimed is:

1. A method of producing a four-layer silicon diode; comprising:

a) selecting a first CZ-grown silicon wafer, wherein said first CZ-grown silicon wafer is B-doped with <100> orientation, a resistivity of less than 0.01 Ohm-cm, and an oxygen content of greater than 10 ppma;

b) selecting a second CZ-grown silicon wafer, wherein said second CZ-grown silicon wafer is P-doped with <100> orientation, a resistivity of less than 0.005 Ohm-cm, and an oxygen content of greater than 10 ppma;

c) heating respective CZ-grown silicon wafers in a reducing atmosphere to yield respective out-diffused CZ-grown wafers;

d) preparing surfaces of the respective out-diffused CZ-grown wafers for furnace annealing;

e) HF treating respective out-diffused CZ-grown wafers;

f) positioning the first out-diffused CZ-grown wafer into a first furnace;

g) positioning the second out-diffused CZ-grown wafer into a second furnace, wherein the first and second furnaces are not unitary;

h) annealing the respective first and second out-diffused CZ-grown wafers in a reducing atmosphere to yield respective first and second respective out-diffused gradient wafers;

i) plasma treating respective first and second vacuum-treated out-diffused gradient wafers to grow a thin silica layer thereupon so as to yield respective first and second plasma treated wafers;

j) vacuum treating respective first and second out-diffused gradient wafers to yield respective first and second vacuum-treated out-diffused gradient wafers;

k) mating respective first and second plasma treated wafers to yield a four-layered diode structure.

2. The method of producing a four-layer silicon diode of claim 1 wherein the first out-diffused gradient wafer further defines a first heavy doped n-type layer and a second gradient doped n-type; and wherein the second first heavy doped p-type layer further defines a third gradient doped p-type layer and a fourth heavy doped p-type layer.

3. The method of producing a four-layer silicon diode of claim 1 wherein the respective first and second prepared wafers are annealed between 1000 degrees Celsius and 1350 degrees Celsius for between 1 and 200 hours.

4. The method of producing a four-layer silicon diode of claim 1 wherein the respective said first and second prepared wafers are annealed in respective rapid thermal processing chambers for between 1 and 60 seconds.

5. The method of producing a four-layer silicon diode of claim 4 wherein, after annealing, the respective first and second respective out-diffused gradient wafers were cooled at a rate of between 40 degrees Celsius per second and 400 degrees Celsius per second.

6. The method of producing a four-layer silicon diode of claim 1 and further comprising the step of before j, bonding respective first and second plasma treated wafers to yield a four-layered diode structure.

7. The method of producing a four-layer silicon diode of claim 1 and further comprising the step of after i) and before j), surface-treating the respective first and second first and second plasma treated wafers with argon ion bombardment.

8. The method of producing a four-layer silicon diode of claim 1 wherein during heating, furnace temperature is ramped to 600 degrees Celsius at a rate lower than 10 degrees Celsius per minute.

9. The method of producing a four-layer silicon diode of claim 1 and further comprising the step of after i) and before j), surface-treating the respective first and second first and second plasma treated wafers with antimony ion implantation; and wherein antimony ion implantation amorphizes ion implanted surfaces.

10. The method of producing a four-layer silicon diode of claim 1 wherein before step j), respective first and second first and second plasma treated wafers are bathed in hydrofluoric acid.

11. The method of producing a four-layer silicon diode of claim 1 wherein step j) occurs immediately after respective first and second first and second plasma treated wafers wafers are bathed in hydrofluoric acid.

* * * * *